(12) United States Patent
Jeannot et al.

(10) Patent No.: US 8,609,530 B2
(45) Date of Patent: Dec. 17, 2013

(54) METHOD FOR FORMING A THREE-DIMENSIONAL STRUCTURE OF METAL-INSULATOR-METAL TYPE

(75) Inventors: Simon Jeannot, Montbonnot Saint Martin (FR); Pascal Tannhof, Montbonnot Saint Martin (FR)

(73) Assignees: STMicroelectronics S.A., Montrouge (FR); International Business Machines Corporation, Armonk, NY (US)

( * ) Notice: Subject to any disclaimer, the term of this patent is extended or adjusted under 35 U.S.C. 154(b) by 222 days.

(21) Appl. No.: 13/052,262

(22) Filed: Mar. 21, 2011

(65) Prior Publication Data

US 2011/0227194 A1    Sep. 22, 2011

(30) Foreign Application Priority Data

Mar. 22, 2010   (FR) ...................... 10 52034

(51) Int. Cl.
*H01L 21/4763*    (2006.01)
(52) U.S. Cl.
USPC ............ 438/622; 257/E21.008; 257/E29.343; 257/532; 438/631
(58) Field of Classification Search
USPC ................. 438/622, 631; 257/532, E21.008, 257/E29.343
See application file for complete search history.

(56) References Cited

U.S. PATENT DOCUMENTS

| | | | |
|---|---|---|---|
| 6,228,707 B1 * | 5/2001 | Lin ............................... | 438/250 |
| 6,384,468 B1 | 5/2002 | Bernstein et al. | |
| 2003/0234416 A1 * | 12/2003 | Thomas et al. ............... | 257/306 |
| 2005/0140010 A1 * | 6/2005 | Ning .............................. | 257/758 |
| 2005/0205918 A1 * | 9/2005 | Abiko ........................... | 257/303 |
| 2006/0089001 A1 * | 4/2006 | Erickson et al. .............. | 438/694 |
| 2006/0267206 A1 | 11/2006 | Tanida et al. | |
| 2007/0042542 A1 | 2/2007 | Barth et al. | |
| 2007/0273005 A1 | 11/2007 | Hwang | |
| 2008/0050874 A1 * | 2/2008 | Won et al. ..................... | 438/250 |
| 2008/0272498 A1 | 11/2008 | Yu et al. | |
| 2009/0065836 A1 * | 3/2009 | Kim .............................. | 257/296 |
| 2009/0166880 A1 * | 7/2009 | Chabert et al. ................ | 257/773 |
| 2009/0168293 A1 * | 7/2009 | Kim .............................. | 361/270 |
| 2009/0273881 A1 * | 11/2009 | Wang et al. ................. | 361/301.1 |
| 2009/0283871 A1 | 11/2009 | Chang et al. | |
| 2010/0032764 A1 | 2/2010 | Andry et al. | |
| 2010/0032808 A1 | 2/2010 | Ding et al. | |
| 2011/0227194 A1 * | 9/2011 | Jeannot et al. ................ | 257/532 |
| 2011/0284991 A1 * | 11/2011 | Hijioka et al. ................ | 257/532 |
| 2012/0139028 A1 * | 6/2012 | Park et al. ..................... | 257/324 |
| 2012/0256193 A1 * | 10/2012 | Hebert et al. ................... | 257/77 |
| 2012/0286395 A1 * | 11/2012 | Fischer ......................... | 257/532 |

OTHER PUBLICATIONS

French Search Report dated Nov. 2, 2010 from corresponding French Application No. 10/52034.
French Search Report dated Nov. 1, 2010 from corresponding French Application No. 10/52110.

* cited by examiner

*Primary Examiner* — Jarrett Stark
(74) *Attorney, Agent, or Firm* — Wolf, Greenfield & Sacks, P.C.

(57) ABSTRACT

A method for forming a capacitive structure in a metal level of an interconnection stack including a succession of metal levels and of via levels, including the steps of: forming, in the metal level, at least one conductive track in which a trench is defined; conformally forming an insulating layer on the structure; forming, in the trench, a conductive material; and planarizing the structure.

8 Claims, 5 Drawing Sheets

METHOD FOR FORMING A THREE-DIMENSIONAL STRUCTURE OF METAL-INSULATOR-METAL TYPE

CROSS REFERENCE TO RELATED APPLICATIONS

This application claims the priority benefit of French patent application Ser. No. 10/52034, filed on Mar. 22, 2010, entitled "METHOD FOR FORMING A THREE-DIMENSIONAL STRUCTURE OF METAL-INSULATOR-METAL TYPE," which is hereby incorporated by reference to the maximum extent allowable by law.

BACKGROUND OF THE INVENTION

1. Field of the Invention

The present invention relates to a method for forming a three-dimensional metal-insulator-metal capacitive structure in an interconnection stack, and to the resulting structure.

2. Discussion of the Related Art

Conventionally, to provide integrated circuit chips, electronic components are formed at the surface of a semiconductor substrate. To connect the electronic components to one another, a stack of interconnection levels comprising metal tracks and vias surrounded with a dielectric material is formed above the substrate. Each level of the interconnection stack conventionally comprises a first stage in which are formed metal vias (called "via level" hereafter) and a second stage in which are formed metal tracks (called "metal level" hereafter).

Figures 1, 2A:
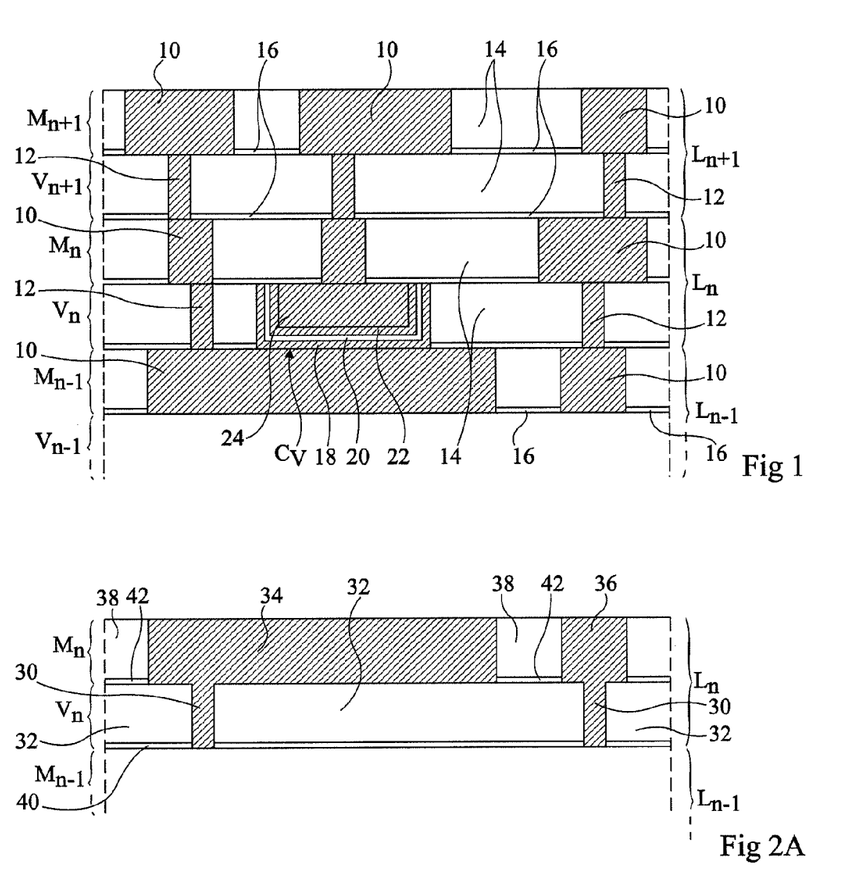
FIG. 1, previously described, is a cross-section view illustrating a portion of an interconnection stack of an integrated circuit comprising a capacitive structure.
FIGS. 2A to 2H are cross-section views illustrating steps of a first method according to an embodiment of the present invention.

The direct integration of capacitive metal-insulator-metal structures (better known as MIMs) in certain portions of the interconnection levels is known. FIG. 1 illustrates an example of such a structure as described, for example, in "High performance 3D damascene MIM capacitors integrated in copper back-end technologies" by S. Cremer, C. Richard, D. Benoit, C. Besset, J. R. Manceau, A. Farcy, C. Perrot, N. Segura, M. Marin, S. Becu, S. Boret, M. Thomas, S. Guillaumet, A. Bonnard, P. Delpech, S. Bruyere, published in 2006 Bipolar/BiCMOS Circuits and Technology Meeting (IEEE Cat No. 06CH37813), 2006.

FIG. 1 partially shows three interconnection levels $L_{n-1}$, $L_n$, and $L_{n+1}$, each level comprising a via level, respectively $V_{n-1}$, $V_n$, and $V_{n+1}$, and a metal level, respectively $M_{n-1}$, $M_n$, and $M_{n+1}$.

Metal tracks 10 are formed in each of metal levels $M_{n-1}$, $M_n$, and $M_{n+1}$. Metal tracks 10 are, for example, made of copper or of aluminum. In each of via levels $V_{n-1}$, $V_n$, and $V_{n+1}$ are provided conductive vias 12 enabling to connect metal tracks 10 of adjacent interconnection levels to one another. A dielectric material 14 surrounds the conductive regions of the interconnection stack and insulates these regions from one another. An insulating layer 16 is provided at the surface of each of metal levels $M_{n-1}$, $M_n$, and $M_{n+1}$ and of via levels $V_{n-1}$, $V_n$, and $V_{n+1}$. Layer 16, generally made to of silicon nitride, aims at avoiding the diffusion of the metal from a metal or via level to adjacent levels.

In the example of FIG. 1, a capacitive structure $C_V$ is provided in via level $V_n$. Capacitive structure $C_V$ is formed above a metal track 10 of metal level $M_{n-1}$, in a trench made in dielectric material 14 of via level $V_n$. Capacitive structure $C_V$ comprises a first conductive layer 18 forming a first electrode which extends on the walls and the bottom of the trench, in contact with track 10. At the surface of first electrode 18 is formed a stack of a layer of a dielectric material 20 and of a second conductive layer 22 forming the second electrode of the capacitive structure. The rest of the trench is filled with a conductive material.

To take a contact on first electrode 18, vias are provided in via level $V_n$ above metal track 10 of metal level $M_{n-1}$. To form a contact with second electrode 22, a metal track portion is provided, in metal level $M_n$, above conductive region 24. A via is provided in via level $V_{n+1}$, above this track portion.

To obtain the structure of FIG. 1, additional steps with respect to conventional methods for forming an interconnection stack are necessary. Indeed, capacitive structure $C_V$ is formed in via level $V_n$ before forming metal level $M_n$ and the tracks and vias of interconnection level $L_n$. Further, in a structure such as that in FIG. 1, the series resistance associated with the capacitor is large and limits the high-frequency performance of the component.

Indeed, capacitor $C_V$ is formed by the placing in parallel of a "horizontal" capacitor, in the bottom of the trench formed in via level $V_n$, and of a "vertical" capacitor, formed at the level of the trench walls. The small thickness of conductive layer 18 implies a significant access resistance at the level of the walls of the capacitive structure, which limits cut-off frequency Fc of the component, defining the limit of the use of the component as a capacitor (as a first approximation, $Fc = \pi * R * C/2$, where R is the series resistance of the component and C its capacitance).

The component is thus only advantageous at low frequency.

Further, in a structure such as that in FIG. 1, metallization $M_n$ cannot be used above capacitive structure $C_V$. Indeed, to avoid forming short-circuits, the metal tracks located above conductive region 24 can only actually play the role of access vias and cannot be directly connected to other tracks of the same level. Thus, the surface above the capacitive structure cannot be used to form other conductive tracks. Two interconnection levels $L_n$ and $L_{n-1}$ are thus necessary to form capacitive structure $C_V$.

The forming of three-dimensional capacitive structures such as capacitive structure $C_V$ over the entire thickness of an interconnection level is also known. However, to obtain such a structure, relatively complex methods may be needed.

There thus is a need for a method for forming capacitive metal-insulator-metal structures in the interconnection stack of an integrated circuit, which overcomes all or part of the above-mentioned disadvantages.

SUMMARY OF THE INVENTION

An object of an embodiment of the present invention is to provide a relatively simple method for forming a three-dimensional capacitive metal-insulator-metal structure in a level of an interconnect stack.

Another object of the present invention is to provide a method for forming a three-dimensional capacitive metal-insulator-metal structure in an interconnection stack, which takes up a limited surface area of this stack.

An object of the present invention more generally is to provide a three-dimensional capacitive metal-insulator-metal structure formed in a single metal level of an interconnect stack, this capacitive structure having a significant capacitance per surface area unit.

Thus, an embodiment of the present invention provides a method for forming a capacitive structure in a metal level of an interconnection stack comprising a succession of metal levels and of via levels, comprising the steps of:

(a) forming, in said metal level, at least one conductive track in which a trench is defined;

(b) conformally forming an insulating layer on the structure;
(c) forming, in the trench, a conductive material; and
(d) planarizing the structure.

According to an embodiment of the present invention, step (b) is preceded by a step of forming a conformal conductive layer.

According to an embodiment of the present invention, step (a) comprises forming a conductive track in the metal level and then performing a reactive ion etching of the conductive track to form a through trench.

According to an embodiment of the present invention, the forming of the conductive track comprises an intermediary step of forming of a conductive layer forming a barrier in the conductive track, the etching of the conductive track being selective over said conductive barrier-forming layer.

According to an embodiment of the present invention, step (a) comprises forming portions of conductive tracks surrounding an insulating region and then selectively etching the insulating region.

According to an embodiment of the present invention, the method further comprises, after step (d), a step of forming of a layer forming a barrier against the diffusion of the material of the conductive track.

According to an embodiment of the present invention, the trench has, in top view, a comb shape.

According to an embodiment of the present invention, the method further comprises, after step (b), a step of forming of a conformal conductive layer.

According to an embodiment of the present invention, the method further comprises, after step (d), a step of forming of a via level on the metal level in which a conductive via is provided in front of the conductive material.

An embodiment of the present invention provides an electronic device comprising a stack of interconnection levels, each interconnection level comprising a via level topped with a metal level, further comprising, in at least one metal level, at least one conductive track in which is defined at least one trench, a three-dimensional capacitive element being formed in the trench, said capacitive element comprising at least one insulating layer formed on the bottom and the walls of the trench, the trench being filled with a conductive material.

The foregoing objects, features, and advantages of the present invention will be discussed in detail in the following non-limiting description of specific embodiments in connection with the accompanying drawings.

DETAILED DESCRIPTION

For clarity, the same elements have been designated with the same reference numerals in the different drawings and, further, as usual in the representation of integrated circuit interconnection levels, the various drawings are not to scale.

To solve the disadvantages of known metal-insulator-metal (MIM) structures, the present inventors provide to form a three-dimensional MIM capacitive structure in a metal level of an interconnection stack only. This enables, among other things, to increase the capacitance per surface area unit of the structure since, generally, metal levels have a greater thickness than via levels. The vertical capacitances of three-dimensional capacitive structures are thus greater in a metal level than in a via level.

Further, to take the best advantage of the vertical capacitive portions of three-dimensional structures, the capacitive structure is directly integrated in a metal track, which avoids the problems of significant access resistances on the thin walls of the MIM structure metal electrodes.

FIGS. 2A to 2H illustrate results of steps of a first example of a method enabling to form a capacitive structure in a metal level of an interconnection stack.

At the step illustrated in FIG. 2A, it is started from a structure comprising a stack of a first interconnection level $L_{n-1}$ and of a second interconnection level $L_n$, where first interconnection level $L_{n-1}$ is not shown in detail. Level $L_n$ comprises a via level $V_n$ topped with a metal level $M_n$. Two vias 30 separated by a dielectric material 32 are provided in via level $V_n$ and, in metal level $M_n$, two metal tracks 34 and 36, for example, made of copper, are formed, each being connected to a via 30. Tracks 34 and 36 are surrounded with a dielectric material 38. Insulating layers 40, 42, may be provided, respectively, above metal level $M_{n-1}$ and above via level $V_n$. As an example, layers 40 and 42 may be made of silicon nitride.

To obtain the structure of FIG. 2A, the so-called dual damascene method may, for example, be used. This method comprises forming the stack of insulating layers 40, 32, 42, and 38, then of performing a first etch, by means of an adapted mask, in metal level $M_n$ and via level $V_n$, to define the location of via regions 30. A second etching, performed by means of a second mask, enables to define the location of metal tracks 34 and 36. Once these etchings have been performed, a metal is deposited on the structure to fill the etched locations. A polishing, for example, a chem.-mech. polishing (CMP), is then carried out to obtain the structure of FIG. 2A having a substantially planar upper surface.

Figure 2B:
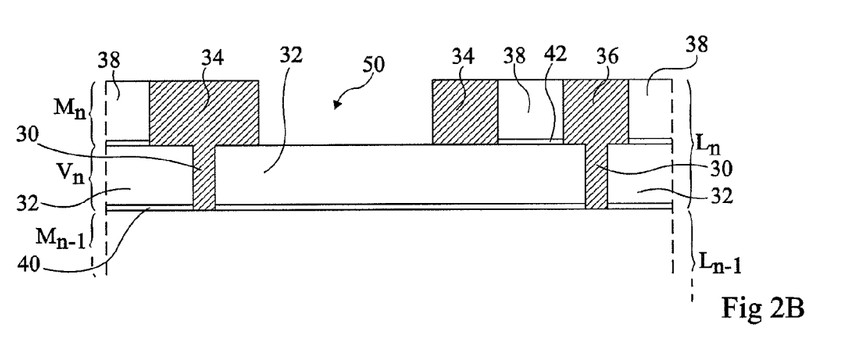

At the step illustrated in FIG. 2B, a trench 50 has been defined within conductive track 34, extending across the entire thickness of this track. Trench 50 may be obtained by different methods. A first method comprises, from structure 2A, directly etching the metal material of track 34 to obtain trench 50. For this purpose, a specific etching is necessary, for example, a reactive ion etching, or RIE.

It may also be provided to form the structure of FIG. 2B by the following method. At the step of FIG. 2A, the location of trench 50 is not filled with a conductive material but with a dielectric material (for example, the same material as that of layer 38). For this purpose, the mask defining the location of metal tracks 34 and 36 is modified so that there is no etching of dielectric material 38 at the level of trench 50. Then, by means of an adapted mask, the dielectric material present at the level of trench 50 is etched. In this case, an additional etching may be provided to remove the portion of the insulating material layer 42 formed in front of trench 50.

Figure 2C:
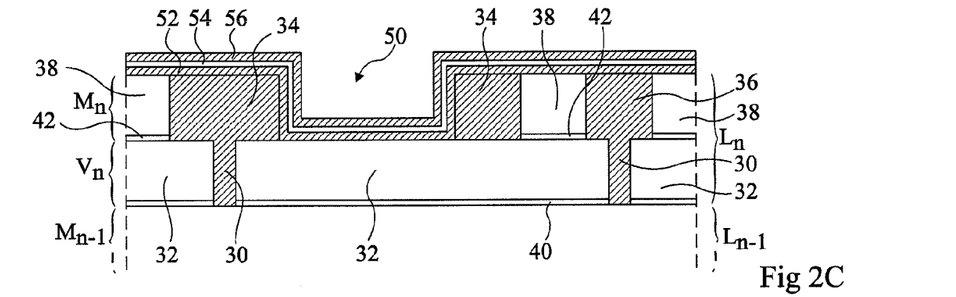

At the step illustrated in FIG. 2C, a first conductive layer 52, a dielectric material 54, and a second conductive layer 56 have been conformally deposited on the structure of FIG. 2B. First conductive layer 52 forms the first electrode of the capacitive structure and second conductive layer 56 forms the second electrode of this capacitive structure. As an example, conductive layers 52 and 56 may be made of titanium nitride, tantalum nitride, tungsten, or ruthenium. As a variation, as will be seen hereafter, first and second conductive layers 52 and 56 may be omitted.

Figure 2D:
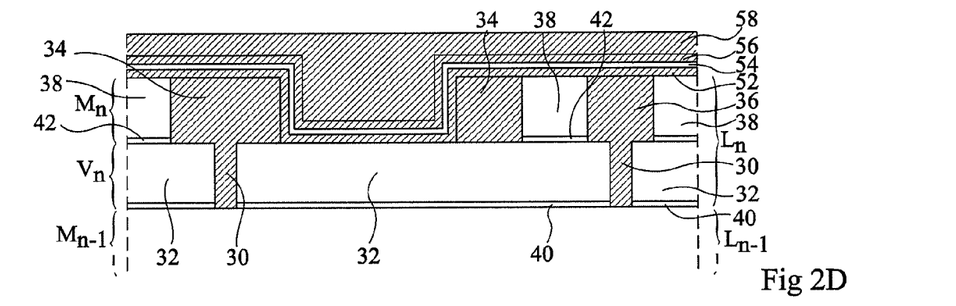

At the step illustrated in FIG. 2D, a conductive material 58 has been deposited over the entire structure to fill the space remaining in trench 50. Material 58 may be electrochemically-deposited copper or aluminum. The presence of conductive material 58 filling trench 50 makes the forming of the layer of conductive material 56 optional.

Figure 2E:
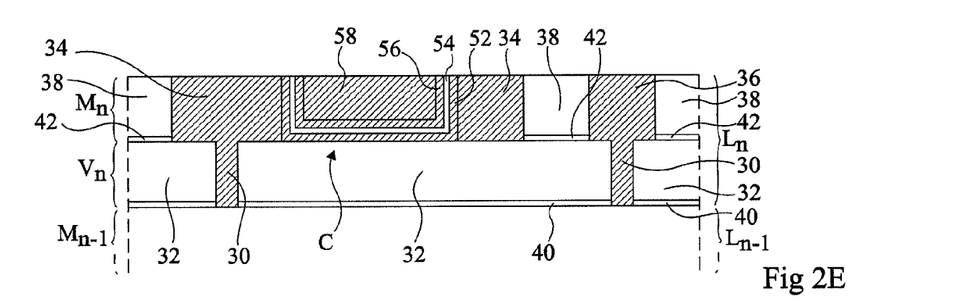

At the step illustrated in FIG. 2E, the structure has been polished to expose the upper surfaces of metal tracks 34 and 36. This polishing may be a chem.-mech. polishing (CMP). A capacitive structure C is thus obtained.

Figure 2F:
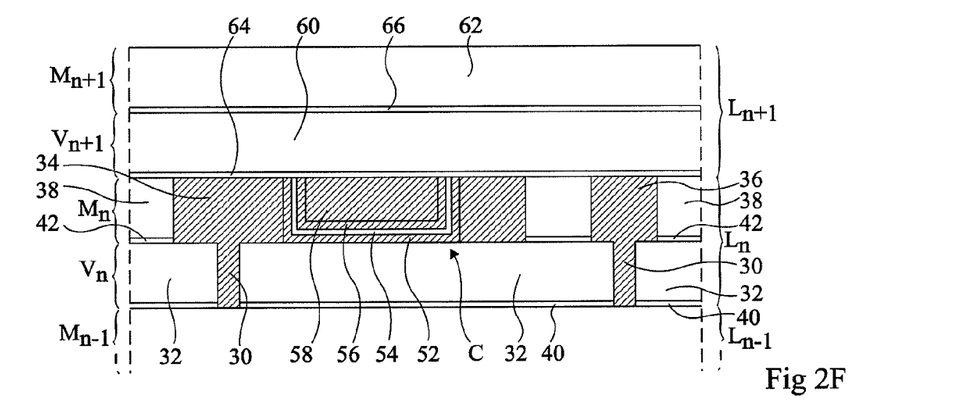

At the step illustrated in FIG. 2F, an upper interconnection level $L_{n+1}$ comprising a stack of a via level $V_{n+1}$ and of a metal level $M_{n+1}$ is formed on top of the structure. Via level $V_{n+1}$ is formed of a layer of a dielectric material 60 and metal level $M_{n+1}$ of a layer of a dielectric material 62. Intermediary layers 64 and 66, for example, made of silicon nitride, may be respectively provided on interconnection level $L_n$ and on layer 60.

Figure 2G:
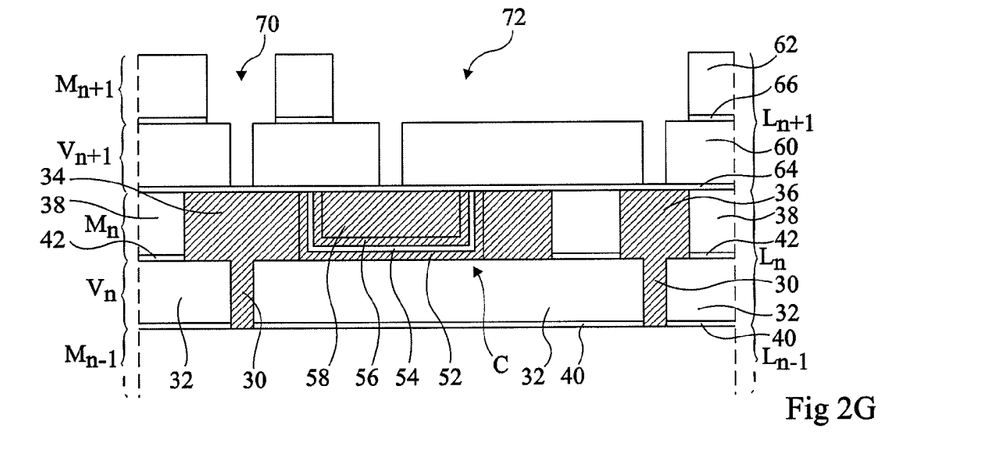

At the step illustrated in FIG. 2G, locations of metal tracks of metal level $M_{n+1}$ and of vias of via level $V_{n+1}$ have been defined, for example, by a method of dual damascene type.

Figure 2H:
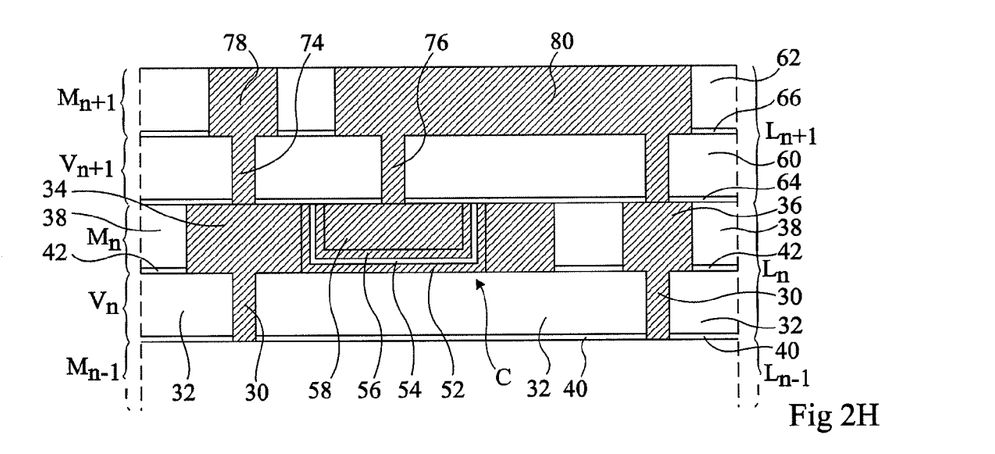

At the step illustrated in FIG. 2H, the etched locations of the metal tracks of level $M_{n+1}$ and of the vias of level $V_{n+1}$ have been filled with a conductive material.

For this purpose, as described in relation with FIG. 2A, the openings formed at the step of FIG. 2G may be filled with a conductive material, after which a CMP polishing of the structure may be performed to obtain a substantially planar upper surface. Vias 74 and 76 of via level $V_{n+1}$ and metal tracks 78 and 80 of metal level $M_{n+1}$ are thus formed.

A device in which capacitive structure C is fully integrated in metal level $M_n$ is thus obtained. The method described herein thus enables to take advantage of the entire surface of metal level $M_{n+1}$ of interconnection level $L_{n+1}$.

Figure 3:
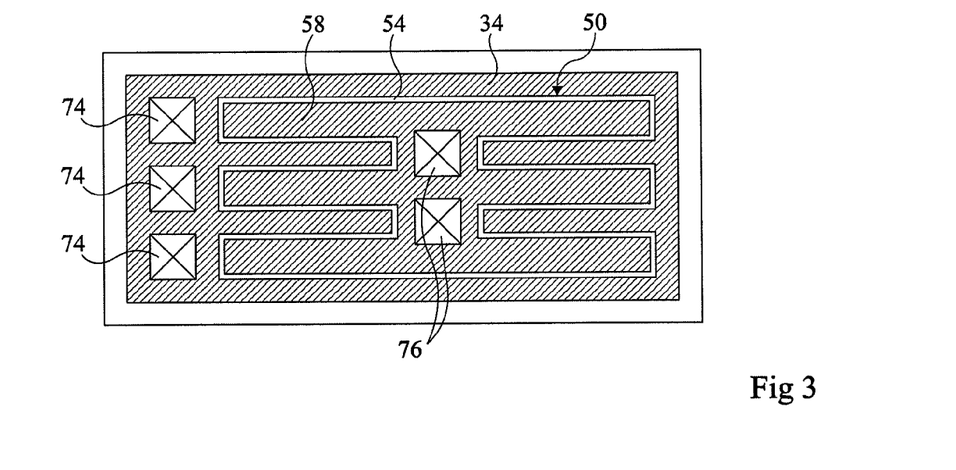
FIG. 3 is a top view illustrating a possible shape of a capacitive structure according to an embodiment of the present invention.

FIG. 3 is a top view of level $L_n$ illustrating a structure specific to trench 50 and to the elements which are formed therein. In this example, trench 50 is comb-shaped and comprises a main portion from which secondary portions orthogonal to the main portion extend.

Via(s) 76 intended to be connected to the second electrode of the capacitive structure (material 58) are formed at the level of the main strip of trench 50. Via(s) 74 connected to first electrode 52 of the capacitive structure, and thus to metal track 34, are formed on portions of metal track 34.

A comb-shaped structure such as that of FIG. 3, or any other trench structure having a great number of vertical walls, enables improving the capacitance per surface area unit of the structure. Indeed, the access resistances at the level of the walls of the capacitive element are low since the capacitive structure is directly integrated in a metal track. Thus, the method of FIGS. 2A to 2H provides a capacitive structure having a significant capacitance per surface area unit, typically on the order of 11 fF/µm².

FIGS. 4A to 4D illustrate results of steps of an alternative embodiment of a method for forming a capacitive structure in a metal track of an interconnection stack.

Figure 4A:
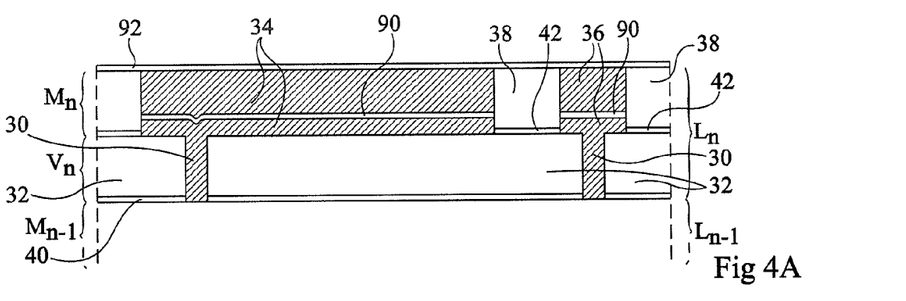
FIGS. 4A to 4D are cross-section views illustrating steps of a second method according to an embodiment of the present invention.

At the step illustrated in FIG. 4A, it is started from a structure similar to that in FIG. 2A in which, at the level of metal tracks 34 and 36 and in the thickness of these layers, an intermediary conductive layer 90 is provided. As an example, intermediary layer 90 may be made of titanium nitride or of tantalum nitride. Intermediary layer 90 may be formed in an intermediary step of the deposition of the conductive material of tracks 34 and 36, for example, by interrupting this deposition, and then depositing layer 90. An insulating layer 92, for example made of silicon nitride, may then be formed above the structure.

Figure 4B:
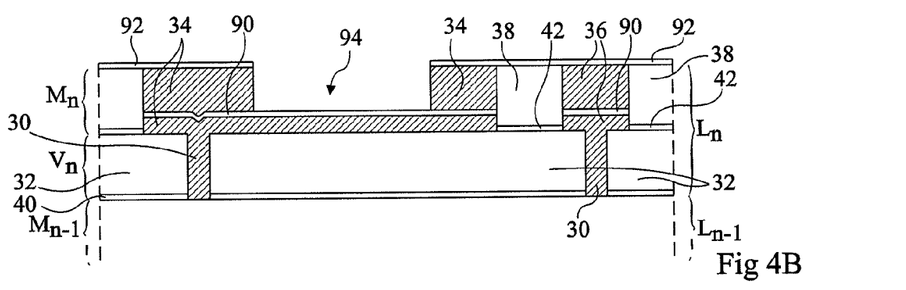

At the step illustrated in FIG. 4B, a trench 94 has been formed in an upper portion of metal track layer 34 by means of an adapted mask, the etching which enables to define trench 94 being selective over the conductive material of layer 90. Thus, trench 94 extends in conductive tracks 34 all the way to layer 90.

Figure 4C:
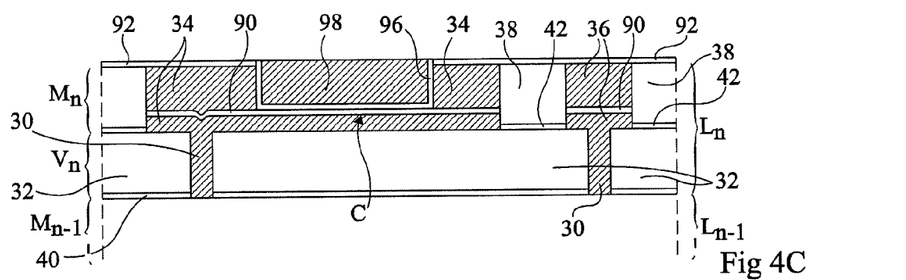

At the step illustrated in FIG. 4C, an insulating layer 96 followed by a conductive material 98 have been deposited on the walls and the bottom of trench 94. A polishing, for example, a chem.-mech. polishing, is then carried out with a stop on insulating layer 92. A capacitive structure C is thus obtained. Advantageously, the stopping of the polishing on insulating layer 92 avoids the forming of a short-circuit which might result from a polishing stopping at the level of the metal tracks of metal level $M_n$, by displacement of metal portions at the structure surface.

Figure 4D:
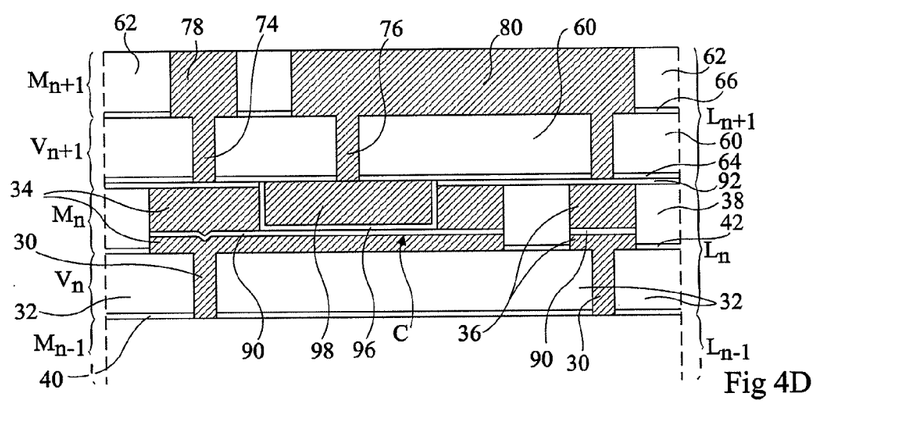

At the step illustrated in FIG. 4D, an upper interconnection level $L_{n+1}$ of the interconnection stack has been formed similarly to the method of FIGS. 2G and 2H, by a dual damascene type method.

The method of FIGS. 4A to 4D has the advantage of requiring no lower electrode deposition, as described in relation with FIG. 2C. Further, according to the positioning of conductive material layer 90 within metal track 34, a good compromise between a low resistance of access to the horizontal portion of the capacitive element and a high capacitance per surface area unit (on the order of 11 fF) can be obtained.

Figure 5A:
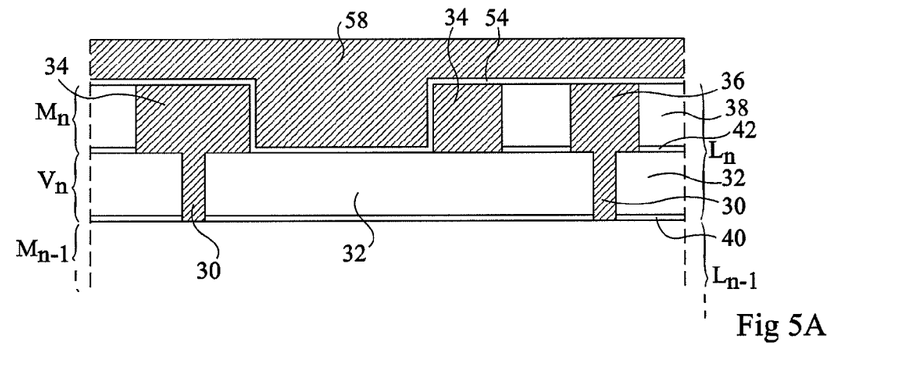
FIGS. 5A and 5B are cross-section views illustrating results of steps of a third method according to an embodiment of the present invention.

FIGS. 5A to 5D illustrate another alternative embodiment of the method of FIGS. 2A to 2H from which electrodes 52 and 56 are absent. FIG. 5A corresponds to the result of the step of FIG. 2D and FIG. 5B corresponds to the result of the step of FIG. 2H.

At the step illustrated in FIG. 5A, a layer 54 of a dielectric material and a conductive material 58 filling trench 50 have been deposited in trench 50 of the device illustrated in FIG. 2B.

Figure 5B:
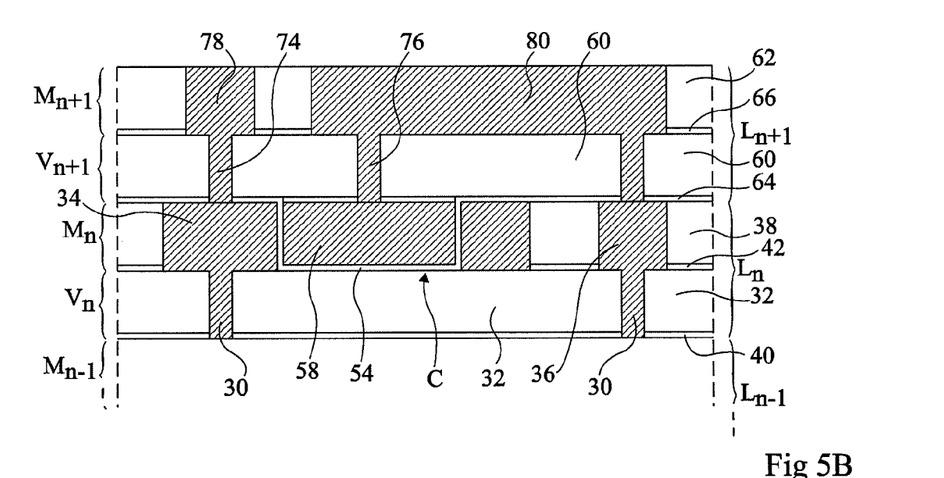

Thus, in a final step illustrated in FIG. 5B, a structure comprising a capacitive structure C formed in metal level $M_n$ is obtained. As compared with the result obtained at the step of FIG. 2H, the capacitance obtained with the method of FIGS. 5A and 5B is slightly lower (typically, 30% lower than that of the structure of FIG. 2H). Indeed, the horizontal portion of the capacitive structure is not present in the device of FIG. 5B. However, the method of FIGS. 5A and 5B is simpler to implement since it requires no deposition of the lower conductive layer forming the first electrode of the capacitive structure.

Thus, the variation of FIGS. 5A and 5B may be used if a particularly simple method is desired to be implemented. Due to the shape of trench 50, a capacitive element such as that in FIG. 5B may have a capacitance per surface area unit on the order of 9 fF/µm², which corresponds to the capacitances currently obtained with devices such as that in FIG. 1.

Thus, the methods disclosed herein provide capacitances per surface area unit which are at least equal to those obtained with known devices. Further, they enable to form a capacitive structure in a single metal level, which strongly decreases the bulk of this capacitive structure. Thus, a metal level located above the capacitive structure may be used at 100% of its surface area.

Specific embodiments of the present invention have been described. Different variations and modifications will occur to those skilled in the art. In particular, it should be noted that the elements described herein may be made of any material adapted to their function. Especially, the conductive tracks and vias may be made of copper or aluminum and the insulating layers may be made of silicon oxide, or of any other adapted insulating material.

Further, metal levels in which metal tracks are formed have been described herein. It should be noted that the materials of these tracks are not limited to metals and that any other adapted conductive material may be used to form these tracks.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a capacitive structure in a metal level of an interconnection stack comprising a succession of metal levels and of via levels, comprising the steps of:

(a) forming, in said metal level, at least one conductive track in which a trench is defined;

(b) conformally forming an insulating layer on the metal level;

(c) depositing, in the trench, a conductive material; and (d) planarizing the structure;

wherein step (a) comprises forming a conductive track in the metal level and then performing a reactive ion etching of the conductive track to form a through trench.

2. The method of claim 1, wherein step (b) is preceded by a step of forming a conformal conductive layer.

3. The method of claim 1, wherein the forming of the conductive track comprises an intermediary step of forming of a conductive layer forming a barrier in the conductive track, the etching of the conductive track being selective over said conductive barrier-forming layer.

4. The method of claim 1, wherein step (a) comprises forming portions of conductive tracks surrounding an insulating region and then selectively etching the insulating region.

5. The method of claim 1, further comprising, after step (d), a step of forming of a layer forming a barrier against the diffusion of the material of the conductive track.

6. The method of claim 1, wherein the trench has, in top view, a comb shape.

7. The method of claim 1, further comprising, after step (b), a step of forming of a conformal conductive layer.

8. The method of claim 1, further comprising, after step (d), a step of forming of a via level on the metal level in which a conductive via is provided in front of the conductive material.

* * * * *

UNITED STATES PATENT AND TRADEMARK OFFICE
CERTIFICATE OF CORRECTION

PATENT NO. : 8,609,530 B2  
APPLICATION NO. : 13/052262  
DATED : December 17, 2013  
INVENTOR(S) : Simon Jeannot et al.

Page 1 of 1

It is certified that error appears in the above-identified patent and that said Letters Patent is hereby corrected as shown below:

\*\*In the Specifications:

Column 1, line 57, at the end of the line, delete the word "to".\*\*

Signed and Sealed this  
Eleventh Day of March, 2014

Michelle K. Lee  
*Deputy Director of the United States Patent and Trademark Office*